(12) United States Patent
Leobandung

(10) Patent No.: US 11,037,834 B2
(45) Date of Patent: Jun. 15, 2021

(54) SIMPLE CONTACT OVER GATE ON ACTIVE AREA

(71) Applicant: International Business Machines Corporation, Armonk, NY (US)

(72) Inventor: Effendi Leobandung, Stormville, NY (US)

(73) Assignee: International Business Machines Corporation, Armonk, NY (US)

(\*) Notice: Subject to any disclaimer, the term of this patent is extended or adjusted under 35 U.S.C. 154(b) by 0 days.

(21) Appl. No.: 16/564,632

(22) Filed: Sep. 9, 2019

(65) Prior Publication Data

US 2019/0393098 A1  Dec. 26, 2019

Related U.S. Application Data

(62) Division of application No. 15/819,109, filed on Nov. 21, 2017, now Pat. No. 10,529,624.

(51) Int. Cl.
*H01L 23/535* (2006.01)
*H01L 27/088* (2006.01)
(Continued)

(52) U.S. Cl.
CPC ........... *H01L 21/823475* (2013.01); *H01L 21/76805* (2013.01); *H01L 21/76895* (2013.01);
(Continued)

(58) Field of Classification Search
CPC . H01L 21/768–76805; H01L 21/76895; H01L 21/76897; H01L 21/823418; H01L 21/823425; H01L 21/823437; H01L 21/823427; H01L 21/823462; H01L 21/823468; H01L 21/823475; H01L 23/481–482; H01L 23/535;
(Continued)

(56) References Cited

U.S. PATENT DOCUMENTS

| | | | |
|---|---|---|---|
| 6,686,247 B1 * | 2/2004 | Bohr | H01L 21/76897 438/301 |
| 8,994,081 B2 * | 3/2015 | Leobandung | H01L 29/78696 257/288 |

(Continued)

OTHER PUBLICATIONS

List of IBM Patents or Patent Applications Treated as Related.

*Primary Examiner* — Maliheh Malek
(74) *Attorney, Agent, or Firm* — L. Jeffrey Kelly; Ryan, Mason & Lewis, LLP

(57) ABSTRACT

Semiconductor devices and methods are provided. For example, a semiconductor device includes a plurality of semiconductor fins patterned in a starting semiconductor substrate; a set of gate structures formed on the starting semiconductor substrate; a set of spacers formed around each of the set of gate structures; a source and drain region grown around the plurality of semiconductor fins; a conductive metal material on the source and drain region, an insulating material disposed over an upper surface of the conductive metal material and the gate structure; and a plurality of metal contacts in the insulator material. The bottom surface of the plurality of metal contacts is in contact with at least a portion of an upper surface of the gate structure and at least a portion of an upper surface of the conductive metal material.

20 Claims, 13 Drawing Sheets

(51) Int. Cl.
  *H01L 23/528* (2006.01)
  *H01L 29/08* (2006.01)
  *H01L 21/8234* (2006.01)
  *H01L 21/768* (2006.01)
  *H01L 23/532* (2006.01)

(52) U.S. Cl.
  CPC .... *H01L 21/823431* (2013.01); *H01L 23/535* (2013.01); *H01L 23/53228* (2013.01); *H01L 23/53257* (2013.01); *H01L 27/0886* (2013.01); *H01L 29/0847* (2013.01); *H01L 21/823418* (2013.01); *H01L 21/823437* (2013.01)

(58) Field of Classification Search
  CPC ... H01L 23/5383–5384; H01L 27/0886; H01L 27/0924; H01L 27/10826; H01L 27/10879; H01L 29/0843–0847; H01L 29/40114; H01L 29/66007; H01L 29/66045; H01L 29/66795–786
  See application file for complete search history.

(56) References Cited

U.S. PATENT DOCUMENTS

| | | | | |
|---|---|---|---|---|
| 9,324,812 | B2* | 4/2016 | Yang | H01L 29/068 |
| 9,397,049 | B1* | 7/2016 | Fan | H01L 21/76897 |
| 9,425,105 | B1* | 8/2016 | Basker | H01L 21/845 |
| 9,425,291 | B1* | 8/2016 | Balakrishnan | H01L 29/0673 |
| 9,431,486 | B1* | 8/2016 | Ok | H01L 29/1054 |
| 9,450,046 | B2* | 9/2016 | Wen | H01L 29/42392 |
| 9,484,439 | B1* | 11/2016 | Cheng | H01L 29/66795 |
| 9,496,379 | B2* | 11/2016 | Leobandung | H01L 29/775 |
| 9,543,211 | B1* | 1/2017 | Lu | H01L 21/823437 |
| 9,548,250 | B1* | 1/2017 | Basker | H01L 29/66553 |
| 9,553,166 | B1* | 1/2017 | Cheng | H01L 29/66553 |
| 9,564,506 | B2* | 2/2017 | Leobandung | H01L 21/31144 |
| 9,721,848 | B1* | 8/2017 | Bu | H01L 21/823431 |
| 9,735,273 | B1* | 8/2017 | Leobandung | H01L 29/7848 |
| 9,768,077 | B1* | 9/2017 | Adusumilli | H01L 23/485 |
| 9,768,272 | B2* | 9/2017 | Hashemi | H01L 29/6656 |
| 9,773,903 | B2* | 9/2017 | Cheng | H01L 29/66553 |
| 9,786,546 | B1* | 10/2017 | Hook | H01L 21/76256 |
| 9,812,553 | B1* | 11/2017 | Cheng | H01L 29/6656 |
| 9,818,876 | B1* | 11/2017 | Bouche | H01L 29/7848 |
| 9,825,031 | B1* | 11/2017 | Bouche | H01L 21/76897 |
| 9,865,703 | B2* | 1/2018 | Ando | H01L 29/66545 |
| 9,881,930 | B1* | 1/2018 | Leobandung | H01L 27/11524 |
| 9,899,397 | B1* | 2/2018 | Leobandung | H01L 29/66825 |
| 9,917,060 | B1* | 3/2018 | Gluschenkov | H01L 23/535 |
| 10,037,989 | B1* | 7/2018 | Cheng | H01L 21/31053 |
| 10,062,784 | B1* | 8/2018 | Lee | H01L 21/32 |
| 10,115,824 | B2* | 10/2018 | Gluschenkov | H01L 23/535 |
| 10,128,379 | B2* | 11/2018 | Song | H01L 29/42392 |
| 10,170,586 | B2* | 1/2019 | Cheng | H01L 29/6656 |
| 10,283,513 | B1* | 5/2019 | Zhou | H01L 27/11556 |
| 10,347,657 | B1* | 7/2019 | Leobandung | H01L 29/66772 |
| 10,580,900 | B2* | 3/2020 | Leobandung | H01L 29/78618 |
| 10,644,156 | B2* | 5/2020 | Gao | H01L 29/41775 |
| 2004/0169207 | A1* | 9/2004 | Park | H01L 21/823437 257/250 |
| 2013/0015517 | A1* | 1/2013 | Widjaja | G11C 14/0018 257/316 |
| 2014/0015014 | A1* | 1/2014 | Cheng | H01L 29/167 257/288 |
| 2014/0070320 | A1* | 3/2014 | Mukherjee | H01L 21/823431 257/368 |
| 2014/0077305 | A1* | 3/2014 | Pethe | H01L 21/76895 257/368 |
| 2014/0264612 | A1* | 9/2014 | Cheng | H01L 29/78 257/368 |
| 2014/0332860 | A1* | 11/2014 | Guo | H01L 29/1054 257/288 |
| 2015/0126008 | A1* | 5/2015 | Paul | H01L 27/0886 438/283 |
| 2015/0270171 | A1* | 9/2015 | Basker | H01L 21/76831 257/288 |
| 2016/0020303 | A1* | 1/2016 | Jun | H01L 21/31144 438/299 |
| 2016/0099244 | A1* | 4/2016 | Ho | H01L 29/7848 257/401 |
| 2016/0099342 | A1* | 4/2016 | Basker | H01L 27/0924 438/283 |
| 2016/0111496 | A1* | 4/2016 | Leobandung | H01L 29/66545 257/192 |
| 2016/0148832 | A1* | 5/2016 | Leobandung | H01L 21/743 257/401 |
| 2016/0197158 | A1* | 7/2016 | Leobandung | H01L 21/31144 257/387 |
| 2016/0276466 | A1* | 9/2016 | Leobandung | H01L 29/66795 |
| 2016/0293485 | A1* | 10/2016 | Song | H01L 21/76897 |
| 2016/0307890 | A1* | 10/2016 | Yeo | H01L 29/66795 |
| 2016/0307927 | A1* | 10/2016 | Lee | H01L 29/0657 |
| 2016/0308016 | A1* | 10/2016 | Choi | H01L 29/7845 |
| 2016/0322475 | A1* | 11/2016 | Leobandung | H01L 29/452 |
| 2017/0004998 | A1 | 1/2017 | Pethe et al. | |
| 2017/0092585 | A1* | 3/2017 | Fan | H01L 21/76897 |
| 2017/0092735 | A1* | 3/2017 | Hashemi | H01L 29/6656 |
| 2017/0092763 | A1* | 3/2017 | Cheng | H01L 29/66553 |
| 2017/0110549 | A1* | 4/2017 | Xie | H01L 29/41766 |
| 2017/0125530 | A1* | 5/2017 | Zhang | H01L 29/66545 |
| 2017/0162448 | A1* | 6/2017 | Li | H01L 21/2855 |
| 2017/0170297 | A1* | 6/2017 | Cheng | H01L 29/66522 |
| 2017/0207166 | A1* | 7/2017 | Lai | H01L 21/823814 |
| 2017/0221891 | A1* | 8/2017 | Chen | H01L 23/485 |
| 2017/0243790 | A1* | 8/2017 | Xie | H01L 21/823431 |
| 2017/0256611 | A1* | 9/2017 | Kim | H01L 29/775 |
| 2017/0278752 | A1* | 9/2017 | Ryckaert | H01L 21/31144 |
| 2017/0287780 | A1* | 10/2017 | Park | H01L 21/76897 |
| 2017/0294533 | A1* | 10/2017 | Hook | H01L 21/76256 |
| 2017/0352663 | A1* | 12/2017 | Zhou | H01L 21/31144 |
| 2017/0365692 | A1* | 12/2017 | Leobandung | H01L 29/66795 |
| 2018/0006138 | A1* | 1/2018 | Cheng | H01L 29/66795 |
| 2018/0026114 | A1* | 1/2018 | Cheng | H01L 29/6656 257/401 |
| 2018/0033871 | A1* | 2/2018 | Xie | H01L 29/66439 |
| 2018/0053651 | A1* | 2/2018 | Leobandung | H01L 21/823431 |
| 2018/0053773 | A1* | 2/2018 | Leobandung | H01L 29/66825 |
| 2018/0053821 | A1* | 2/2018 | Mallela | H01L 21/764 |
| 2018/0108769 | A1* | 4/2018 | Cheng | H01L 29/66545 |
| 2018/0114861 | A1* | 4/2018 | Gluschenkov | H01L 21/76846 |
| 2018/0211874 | A1* | 7/2018 | Basker | H01L 21/76834 |
| 2018/0248042 | A1* | 8/2018 | Hook | H01L 21/76897 |
| 2018/0254220 | A1* | 9/2018 | Leobandung | H01L 21/324 |
| 2018/0261507 | A1* | 9/2018 | Jacobi | H01L 21/28088 |
| 2018/0269320 | A1* | 9/2018 | Chi | H01L 29/66795 |
| 2018/0286956 | A1* | 10/2018 | Xie | H01L 29/42376 |
| 2018/0286959 | A1* | 10/2018 | Wang | H01L 29/785 |
| 2018/0301348 | A1* | 10/2018 | Lin | H01L 21/3212 |
| 2018/0301371 | A1* | 10/2018 | Wang | H01L 21/76816 |
| 2018/0308750 | A1* | 10/2018 | Cheng | H01L 23/485 |
| 2018/0337256 | A1* | 11/2018 | Anderson | H01L 29/1037 |
| 2019/0006515 | A1* | 1/2019 | Cheng | H01L 21/76897 |
| 2019/0035692 | A1* | 1/2019 | Xie | H01L 21/823431 |
| 2019/0043761 | A1* | 2/2019 | Min | H01L 21/76229 |
| 2019/0058035 | A1* | 2/2019 | Cho | H01L 29/7827 |
| 2019/0067452 | A1* | 2/2019 | Cheng | H01L 29/0676 |
| 2019/0088742 | A1* | 3/2019 | Zang | H01L 21/76895 |
| 2019/0096677 | A1* | 3/2019 | Xie | H01L 29/41791 |
| 2019/0103304 | A1* | 4/2019 | Lin | H01L 21/823821 |
| 2019/0123162 | A1* | 4/2019 | Xie | H01L 21/76834 |
| 2019/0131428 | A1* | 5/2019 | Huang | H01L 21/823842 |
| 2019/0189806 | A1* | 6/2019 | Leobandung | H01L 21/02532 |
| 2019/0214343 | A1* | 7/2019 | Lee | H01L 29/42392 |
| 2019/0229218 | A1* | 7/2019 | Leobandung | H01L 21/8258 |
| 2019/0305082 | A1* | 10/2019 | Ching | H01L 21/823878 |
| 2020/0006656 | A1* | 1/2020 | Leobandung | H01L 45/1675 |
| 2020/0020695 | A1* | 1/2020 | Leobandung | H01L 29/66545 |
| 2020/0066531 | A1* | 2/2020 | Leobandung | H01L 21/823892 |
| 2020/0075723 | A1* | 3/2020 | Lee | H01L 29/0847 |
| 2020/0083227 | A1* | 3/2020 | Leobandung | H01L 27/10823 |
| 2020/0119009 | A1* | 4/2020 | Kim | H01L 21/76897 |
| 2020/0135885 | A1* | 4/2020 | Xie | H01L 21/76831 |

(56) References Cited

U.S. PATENT DOCUMENTS

2020/0168724 A1* 5/2020 Huang .............. H01L 29/66356
2020/0357896 A1* 11/2020 Cheng ............. H01L 21/823481
2020/0381354 A1* 12/2020 Mignot ............. H01L 21/76807
2020/0381480 A1* 12/2020 Reznicek .............. H01L 29/737
2021/0013108 A1* 1/2021 Wu ................... H01L 29/66666

* cited by examiner

SIMPLE CONTACT OVER GATE ON ACTIVE AREA

BACKGROUND

This disclosure generally relates to semiconductor fabrication techniques and, in particular, techniques for fabricating FET (field effect transistor) devices.

As semiconductor manufacturing technologies continue to evolve toward smaller design rules and higher integration densities (e.g., 14 nm technology node and beyond), integrated circuit devices and components become increasingly smaller, creating challenges in layout formation and device optimization. Currently, FinFET technologies are typically implemented for FET fabrication, as such technologies provide effective complementary metal-oxide-semiconductor (CMOS) scaling solutions for FET fabrication at, and below, the 14 nm technology node. A FinFET device comprises a three-dimensional fin-shaped FET structure which includes at least one vertical semiconductor fin structure formed on a substrate, a gate structure formed over a portion of the vertical semiconductor fin, and source/drain regions formed from portions of the vertical semiconductor fin which extend from both sides of the gate structure. The portion of the vertical semiconductor fin that is covered by the gate structure between the source/drain regions comprises a channel region of the FinFET device. With FinFET and other types of FET devices, scaling is determined, in party, by how closely conductive source/drain and gate contacts can be formed in proximity to each other for a given layout without resulting in electrical shorts.

SUMMARY

Embodiments described herein provide methods of forming semiconductor devices.

For example, one exemplary embodiment includes a method for fabricating a semiconductor device, comprising:

forming a field effect transistor (FET) device on a semiconductor substrate, the FET device comprising a source/drain layer, a first insulator layer on the source/drain layer and a gate structure comprising a gate electrode layer, a gate capping layer, and a gate sidewall spacer;

etching at least a portion of the first insulator layer to provide an opening having an exposed top surface of the source/drain layer, wherein the etching of at least a portion of the first insulator layer is selective to the gate structure;

depositing a conductive metal material to completely fill the opening;

patterning an upper surface of the conductive metal material to a target width of the conductive metal material and recessing the upper surface of the conductive metal material down to a target depth in the conductive metal material to provide a recessed opening;

forming a planarized second insulator layer on a top surface of the gate structure and to completely fill the recessed opening;

forming a metal contact opening in the planarized second insulator layer to an upper portion of the recessed opening and to at least a portion of a top surface of the gate structure below the gate capping layer; and depositing an interconnect conductor to completely fill the metal contact opening to a top surface of the second insulator layer.

Another exemplary embodiment includes a semiconductor device which comprises a plurality of semiconductor fins patterned in a starting semiconductor substrate; a set of gate structures formed on the starting semiconductor substrate; a set of spacers formed around each of the set of gate structures; a source and drain region grown around the plurality of semiconductor fins; a conductive metal material on the source and drain region, an insulating material is configured to be deposited over an upper surface of the conductive metal material and the gate structure; and a plurality of metal contacts in the insulator material. The bottom surface of the plurality of metal contacts is in contact with at least a portion of an upper surface of the gate structure and at least a portion of an upper surface of the conductive metal material.

These and other features, objects and advantages of the present invention will become apparent from the following detailed description of illustrative embodiments thereof, which is to be read in connection with the accompanying drawings.

BRIEF DESCRIPTION OF THE DRAWINGS

FIGS. 1 through 13 schematically illustrate a process for fabricating FinFET devices with gate contacts formed in active regions overlapping source/drain contacts, according to an embodiment of the invention, wherein:

DETAILED DESCRIPTION

Embodiments of the invention will now be discussed in further detail with regard to FET devices having gate contacts formed in active regions overlapping source/drain contacts, as well as methods for fabricating FET devices with gate contacts formed in active regions overlapping source/drain contacts while preventing electrical shorts between overlapping portions of the gate and source/drain contacts. It is to be understood that the various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures.

Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error may be present, such as 1% or less than the stated amount.

An illustrative embodiment for forming a semiconductor device will be described below with reference to FIGS. 1-13. The semiconductor device has self-aligned gate contacts placed laterally overlapping but vertically isolated from both the active region of a FET device and from the adjacent source/drain contacts by dielectric filled recess plugs formed in the upper recessed portions of the source/drain contacts proximate to the gate contacts.

Figure 1A:
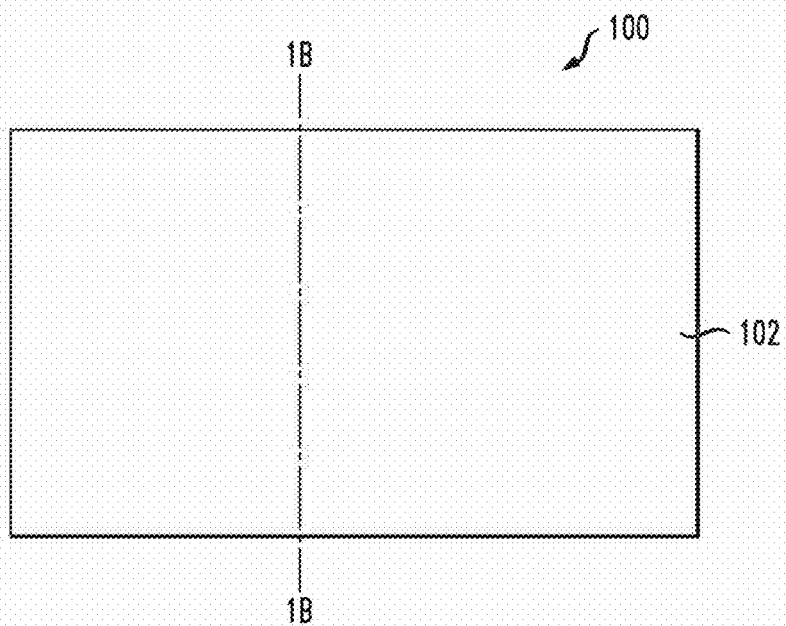
FIGS. 1A and 1B depict a plan view and a cross-sectional view of a starting semiconductor substrate after the formation of a set of fins, in accordance with an embodiment of the present invention.
Figure 1B:
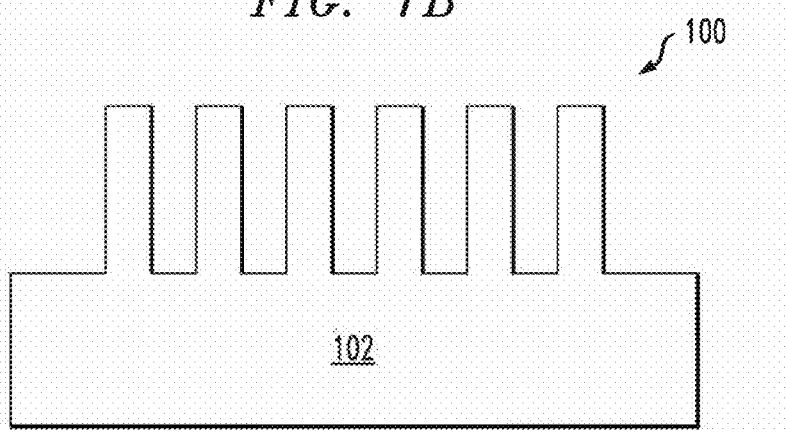

Referring now to the figures, FIG. 1A is a plan view of a starting semiconductor substrate 102 for semiconductor device 100 after the formation of a set of fins, and FIG. 1B is a cross-sectional view of the starting semiconductor substrate 102 after the formation of a set of fins, taken along the line 1B-1B of FIG. 1A. In this exemplary embodiment, substrate 102 is composed of silicon. In other embodiments, substrate 102 may be composed of other semiconductor substrate materials, such as III-V semiconductor materials, II-VI semiconductor materials, Ge, and SiGe. The fins are defined on substrate 102 using any standard etching processes know in the art. For example, fin patterns may be formed and etched into substrate 100 using known photolithography techniques.

Figure 2A:
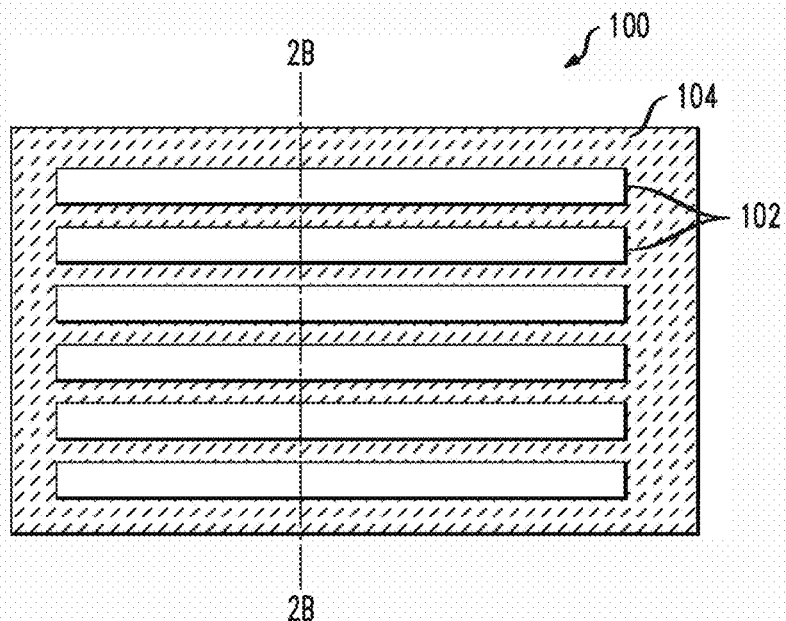
FIGS. 2A and 2B depict a plan view and a cross-sectional view of the semiconductor device after the creation of device regions on the starting semiconductor substrate of FIGS. 1A and 1B through shallow trench isolation (STI), in accordance with an embodiment of the present invention.
Figure 2B:
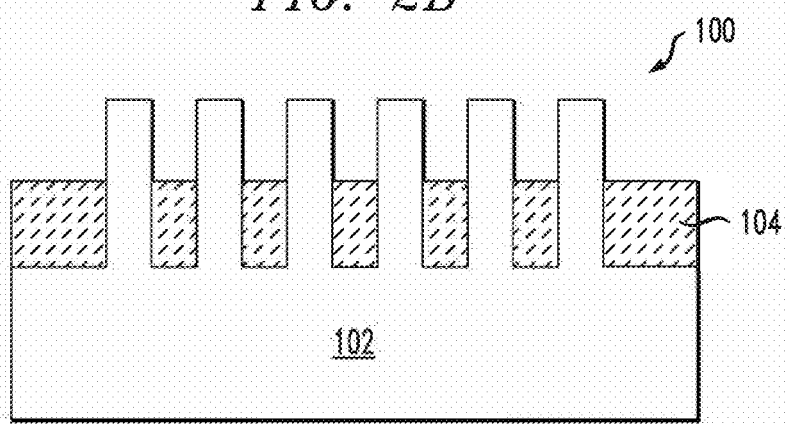

Referring now to FIGS. 2A and 2B, FIG. 2A depicts a plan view of the semiconductor device 100 after the creation of device regions on starting semiconductor substrate 102 of FIGS. 1A and 1B through shallow trench isolation (STI), and FIG. 2B is a cross-sectional view of the semiconductor device 100 after the creation of device regions on starting semiconductor substrate 102 of FIGS. 1A and 1B, taken along the line 2B-2B of FIG. 2A. In this exemplary embodiment, device regions are created through STI within substrate 102. In one embodiment, the shallow trenches are filled with one or more insulating materials 104, such as $SiO_2$ or other oxide materials, to isolate the fins from each other. This prevents electrical leakage between adjacent semiconductor device components, preventing one device region from affecting another device region or shorting out through contact with another. After the deposition of insulating materials 104, a standard planarization process known in the art may be performed, such as chemical mechanical polishing (CMP) and/or grinding.

In an alternative embodiment of the present application (not shown), each fin of the plurality of fins is a semiconductor nanowire whose ends are attached to a corresponding semiconductor material pad region. In yet another embodiment (also not shown), each fin may represent a semiconductor active device region of a planar semiconductor substrate.

Figure 3A:
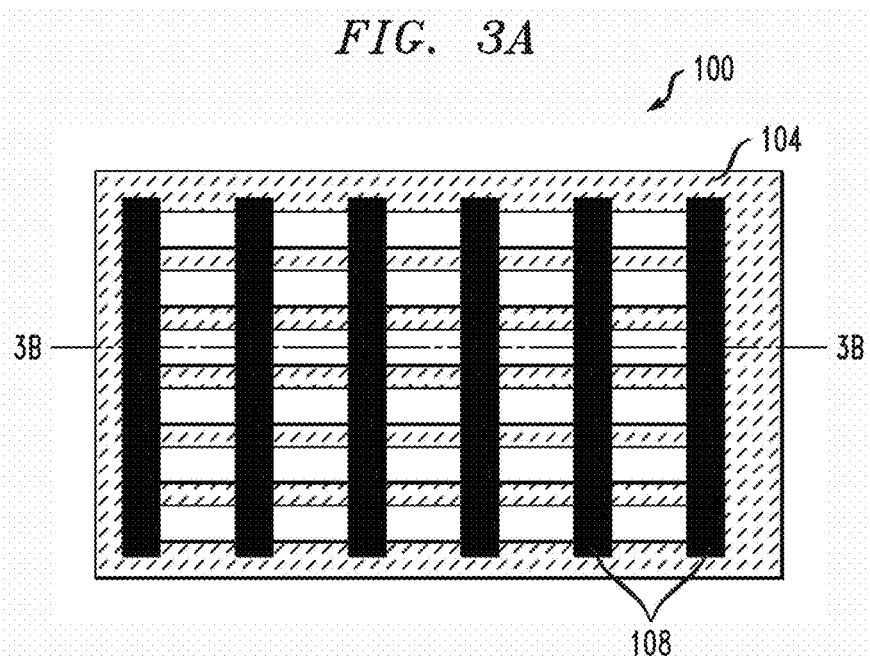
FIGS. 3A and 3B depict a plan view and a cross-sectional view of the semiconductor device after the formation of dummy gate structures, in accordance with an embodiment of the present invention.
Figure 3B:
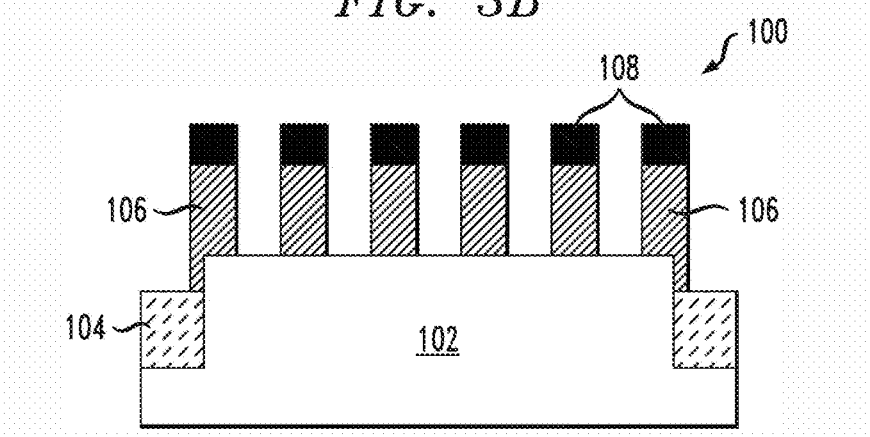

Referring now to FIGS. 3A and 3B, FIG. 3A depicts a plan view of the semiconductor device 100 after the formation of gate structures 106 and hard mask 108, and FIG. 3B is a cross-sectional view of the semiconductor device after the formation of gate structures 104, taken along the line 3B-3B of FIG. 3A. Gate structures 106 are formed using a conventional deposition process including, for example, atomic layer deposition (ALD), molecular layer deposition (MLD), chemical vapor deposition (CND), and physical vapor deposition (PYD), among other known processes. Gate structures 106 may be dummy gate structures or actual gate structures, e.g., a-Si. In this exemplary embodiment, subsequent to the deposition of gate structures 106, a planarization process is performed to remove a portion of gate structures 106. The planarization process may be any conventional planarization process, such as CMP and/or grinding. After planarization, hard mask 108 is deposited on top of gate structure 106. Hard mask material 108 can be, for example, an oxide or nitride material. Hard mask 108 and gate structures 106 are then patterned by lithography and etching. The lithographic and etching processes employed in patterning gate structures 106 may be the same as those mentioned above for patterning the fins.

Figure 4A:
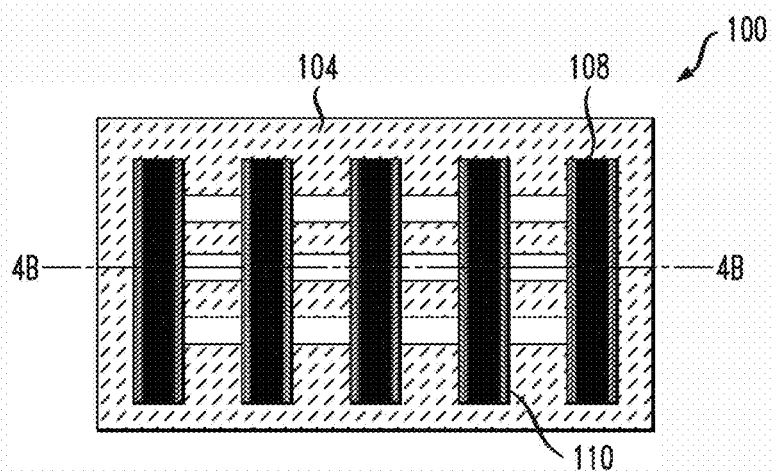
FIGS. 4A and 4B depict a plan view and cross-sectional view of the semiconductor device after depositing a spacer material, in accordance with an embodiment of the present invention.
Figure 4B:
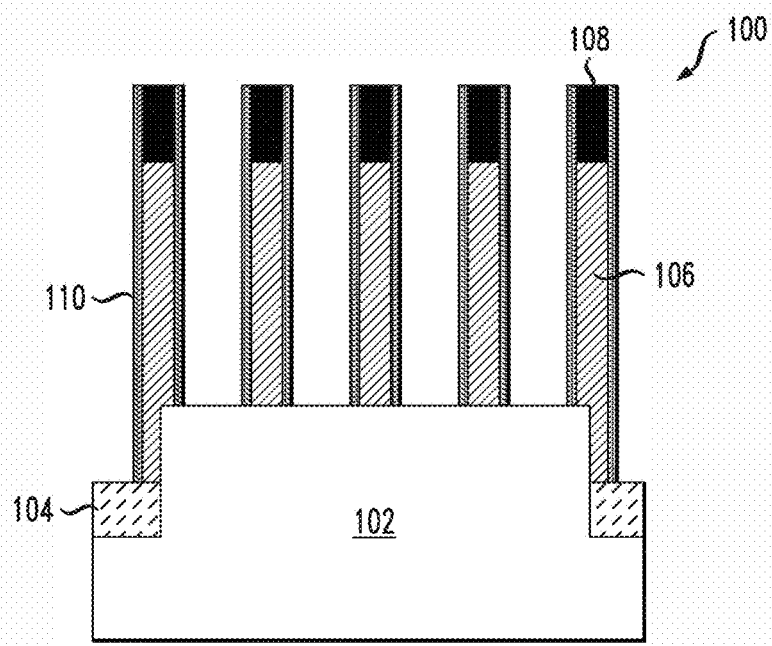

Referring now to FIGS. 4A and 4B, FIG. 4A depicts a plan view of the semiconductor device 100 after depositing gate spacer material 110 between the gate structures of FIGS. 3A and 3B; and FIG. 4B is a cross-sectional view of the semiconductor device after deposition of gate spacer material 110 between the gate structures of FIGS. 3A and 3B, taken along the line 4B-4B of FIG. 4A. In this exemplary embodiment, gate spacer material 110 is deposited over the exposed upper surfaces of the patterned gate structures 106 and between gate structures 106 using a known deposition process, such as CVD.

The gate spacer material 110 includes a dielectric material, which can be, for example, silicon nitride, silicon oxide, silicon oxynitride, a dielectric metal oxide, a dielectric metal nitride, or a combination thereof. The gate spacer material 110 can be formed, for example, by depositing a conformal dielectric material layer, and by anisotropically etching the conformal dielectric material layer. Horizontal portions of the conformal dielectric material layer are removed by the anisotropic etch, and remaining vertical portions of the conformal dielectric material layer constitute the gate spacer material 110. The thickness of the gate spacer material 110, i.e., the lateral dimension between an inner sidewall of the gate spacer material 110 and a most proximal portion of the outer sidewall of the gate spacer material 110, can vary, e.g., a range from about 5 nm to about 20 nm, although lesser and greater thicknesses can also be employed.

Figure 5A:
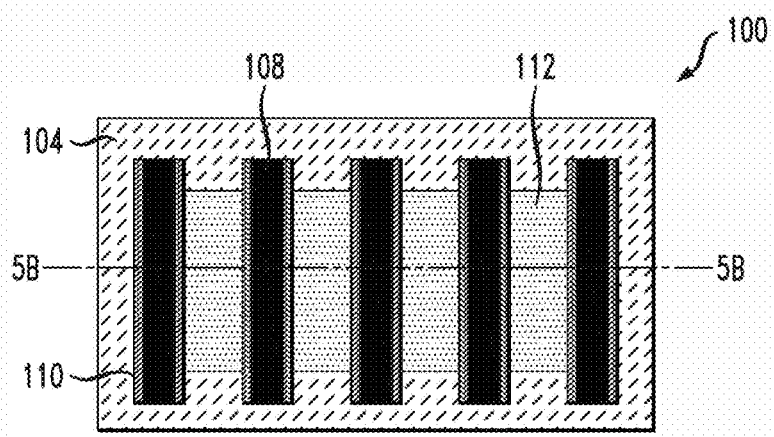
FIGS. 5A and 5B depict a plan view and cross-sectional view of the semiconductor device after forming one or more source-drain regions, in accordance with an embodiment of the present invention.
Figure 5B:
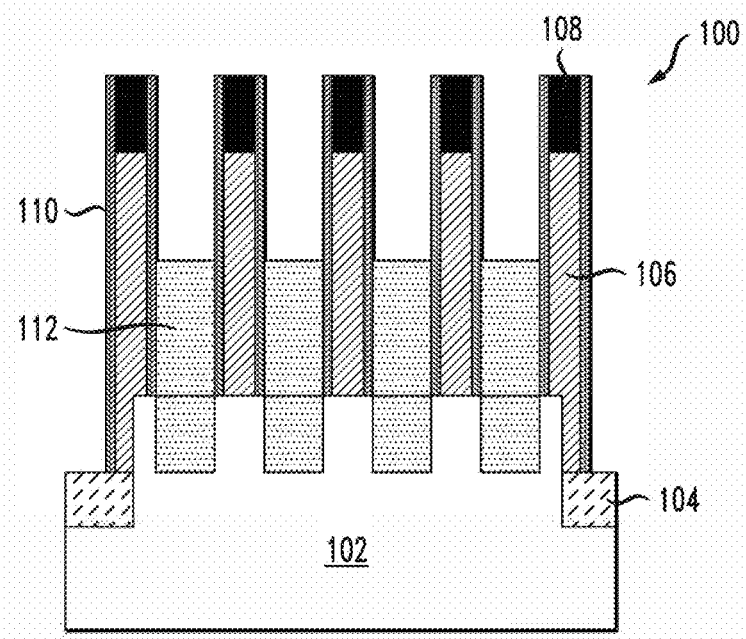

Referring now to FIGS. 5A and 5B, FIG. 5A depicts a plan view of the semiconductor device 100 after forming the one or more source-drain regions 112 (hereinafter "S/D regions") on the exposed regions of the vertical semiconductor fins of FIGS. 4A and 4B; and FIG. 5B is a cross-sectional view of the semiconductor device after forming the S/D regions 112 of FIGS. 4A and 4B, taken along the line 5B-5B of FIG. 5A. In this exemplary embodiment, the S/D regions 112 are formed by growing epitaxial semiconductor material on the exposed surfaces of the S/D regions of the vertical semiconductor fins adjacent to the dummy gate structures. The type of epitaxial material and doping used to form the S/D regions 112 will vary depending on whether the FET devices are P-type or N-type devices. Although not specifically shown in FIG. 5A, the source/drain layers 112 can be epitaxially grown so that adjacent source/drain layers 112 formed on adjacent S/D regions of the vertical semiconductor fins can merge to collectively form a single source/drain layer. In another embodiment, the source/drain regions 112 may be silicide layers that are formed on the exposed surfaces of the S/D regions of the vertical semiconductor fins using known methods.

In an embodiment, the S/D regions 112 may be raised source-drain regions, in which the doped semiconductor material is grown on an upper surface of the semiconductor substrate 102. In another embodiment, the S/D regions 112 may be formed by first forming a trench (not shown) in the semiconductor substrate 102 and then growing the doped semiconductor material in the trench. Examples of semiconductor materials that may be suitable for the epitaxial growth of the S/D regions 112 include, but are not limited to, silicon (single crystal, polysilicon, or amorphous), germanium (single crystal, polycrystalline, or amorphous), or a combination thereof.

After the semiconductor material is grown, it may be doped with dopant atoms using, for example, in-situ doping or ion implantation or in-situ doping during epitaxy. In an embodiment, the semiconductor material may be doped with a p-type dopant such as, for example, boron, aluminum, gallium, indium, or alloys thereof. In another embodiment, the semiconductor material may be doped with a n-type dopant such as, for example, phosphorus, antimony, arsenic, or alloys thereof. After the doping process, the semiconductor material may have dopant a concentration ranging from approximately $1\times10^{19}$ atoms/cm$^3$ to approximately $5\times10^{21}$ atoms/cm$^3$.

After the semiconductor material has been doped, the semiconductor device 100 may be annealed to activate the dopant atoms and to complete the formation of the S/D regions 112. In an embodiment, the annealing process may include subjecting the structure 100 to an elevated temperature, ranging from approximately 800° C. to approximately 1250° C. for approximately 1 ms to approximately 500 ms. In another embodiment, the annealing process may be a rapid thermal anneal (RTA). In yet another embodiment, the annealing process may be a millisecond anneal such as a laser spike anneal or a flash lamp anneal.

Figure 6A:
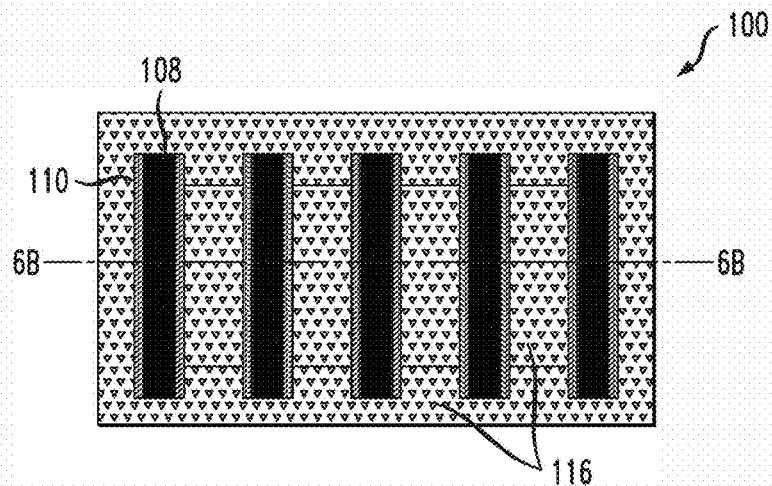
FIGS. 6A and 6B depict a plan view and cross-sectional view of the semiconductor device after depositing a first insulator layer, in accordance with an embodiment of the present invention.
Figure 6B:
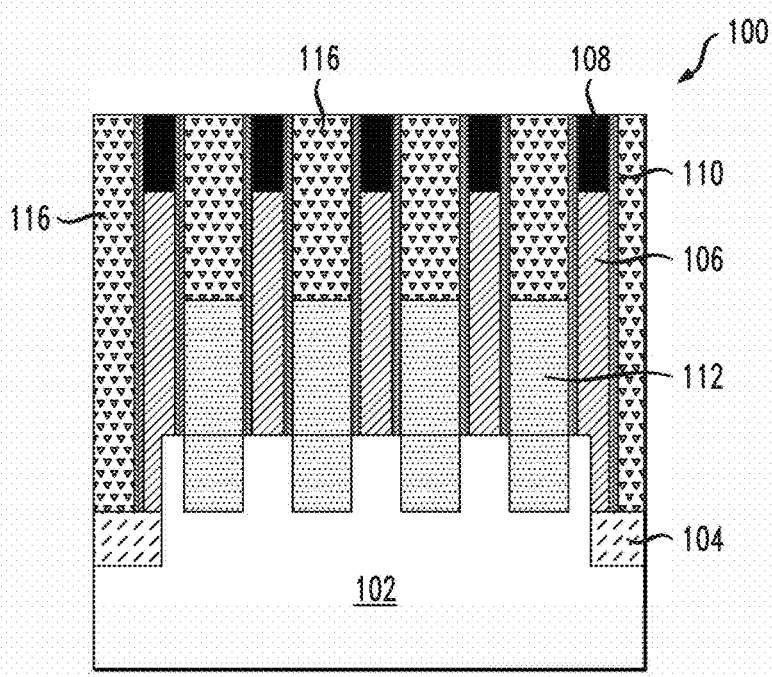

Referring now FIGS. 6A and 6B, FIG. 6A depicts a plan view of the semiconductor device 100 after depositing a first insulator layer 116 over the one or more S/D regions 112 of FIGS. 5A and 5B; and FIG. 6B is a cross-sectional view of the semiconductor device 100 after forming the insulator layer 116 over the one or more S/D regions 112 of FIGS. 5A and 5B, taken along the line 6B-6B of FIG. 6A. The insulator layer 116 can be formed, for example, by depositing one or more layers of insulating material over the surface of the semiconductor substrate to cover the dummy gate structures, and then planarizing the surface of the semiconductor substrate down to a level which exposes the upper surface of the hard mask layer 108 formed on the dummy gate structures. The insulator layer 116 can be formed using suitable dielectric materials including, but not limited to, silicon oxide, hydrogenated silicon carbon oxide (SiCOH), SiCH, SiCNH, or other types of silicon based low-k dielectrics (e.g., k less than about 4.0), porous dielectrics, or known ULK (ultra-low-k) dielectric materials (with k less than about 2.5). For example, the insulator layer 116 may comprise a single deposited layer of insulating material, or multiple layers of insulating material (e.g., a first layer of a flowable oxide and a second layer of insulating material formed on the first layer). The insulator layer 116 may be deposited using known deposition techniques, such as, for example, ALD, PECVD, PVD (physical vapor deposition), or spin-on deposition.

Figure 7A:
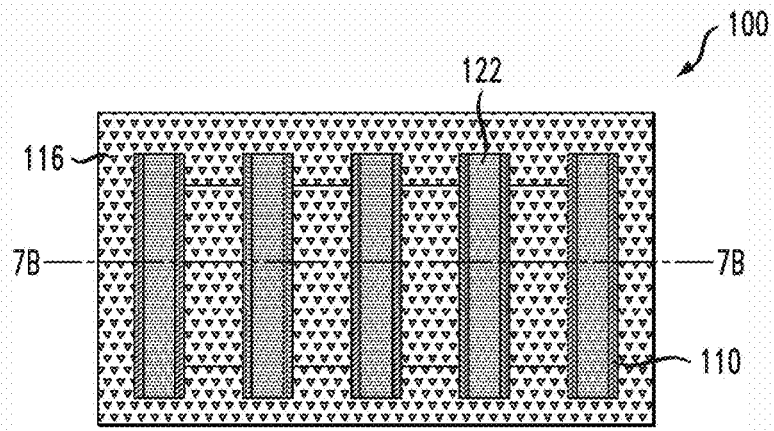
FIGS. 7A and 7B depict a plan view and cross-sectional view of the semiconductor device after removing the dummy gate structures, and then forming the metallic gate structures in place of the dummy gate structures, in accordance with an embodiment of the present invention.
Figure 7B:
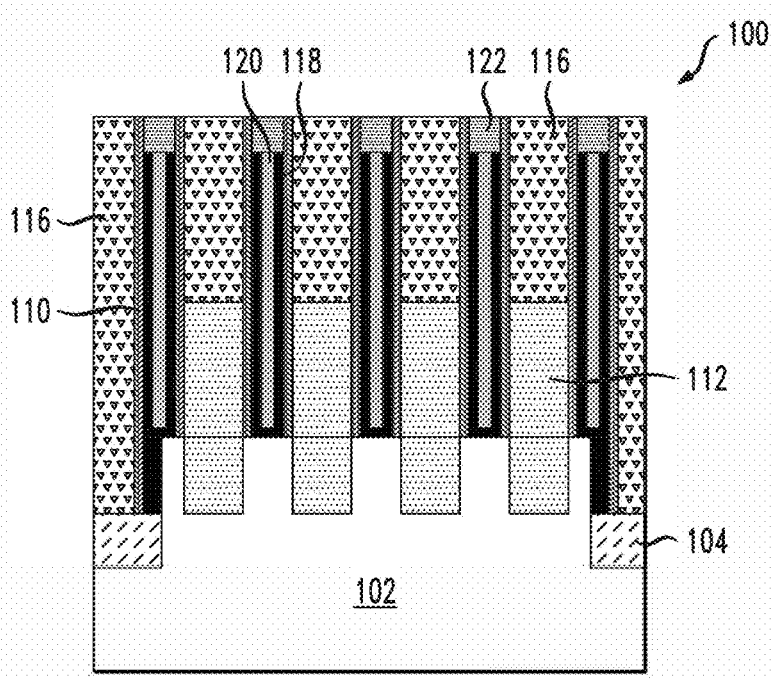

Referring now FIGS. 7A and 7B, FIG. 7A depicts a plan view of the semiconductor device 100 after removing the sacrificial material (e.g., dummy gate oxide and dummy gate poly layers) of the dummy gate structures, and then forming the metallic gate structures in place of the dummy gate structures; and FIG. 7B is a cross-sectional view of the semiconductor device 100 after forming the gate structures, taken along the line 7B-7B of FIG. 7A. In this exemplary embodiment, a replacement gate process in accordance with aspects of the present invention is carried out. The replacement gate process includes the removal of the dummy structure 106 and hard mask material 108 using conventional etching processes. In embodiments, the dummy structure and hard mask material can be removed in separate etching steps, reactive to each material. In accordance with aspects of the present invention, a mask is not required to remove these materials.

In one embodiment, the metal gate structures are formed by depositing one or more conformal layers of gate dielectric material over the surface of the semiconductor structure, and depositing one or more layers of conductive material over the gate dielectric material. A planarization process (e.g., CMP) is then performed to polish the surface of the semiconductor structure down to the insulator layer 116, thereby removing the overburden portions of the gate dielectric and conductive materials, and forming the gate electrode layer 120 and gate dielectric layer 118 of the metal gate structures.

The gate dielectric layers 118 are formed with any suitable dielectric material including, for example, nitride, oxynitride, or oxide or a high-k dielectric material having a dielectric constant of about 3.9 or greater. In particular, the gate dielectric material 118 can include silicon oxide, silicon nitride, silicon oxynitride, boron nitride, high-k materials, or any combination of these materials. Examples of high-k materials include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k gate dielectric material may further include dopants such as lanthanum, and aluminum. The high-k dielectric material layer may be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition or other like processes. The thickness of the high-k dielectric material may vary depending on the deposition process as well as the composition and number of high-k dielectric materials used. The high-k dielectric material layer may have a thickness in a range from about 0.5 to about 20 nm.

The gate electrode layers 120 are formed with any suitable conductive material including, for example, doped polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of such conductive materials. The layer of conductive material may further comprise dopants that are incorporated during or after deposition. The layer of conductive material is deposited using a suitable deposition process, for example, CVD, PECVD, PVD, plating, thermal or e-beam evaporation, sputtering, etc.

In another embodiment, a thin conformal layer of work-function metal (WFM) may be deposited over the conformal gate dielectric layer 118 prior to forming the gate electrode layer 120. The thin conformal WFM layer can be formed of one or more types of metallic materials, including, but not limited to, TiN, TaN, TiAlC, Zr, W, Hf, Ti, Al, Ru, Pa, TiAl, ZrAl, WAl, TaAl, HfAl, TiAlC, TaC, TiC, TaMgC, or other work function metals or alloys that are commonly used to obtain target work functions which are suitable for the type (e.g., n-type or p-type) of vertical FET devices that are to be formed. The conformal WFM layer is deposited using known methods such as ALD, CVD, etc. In one embodiment, the conformal WFM layer is formed with a thickness in a range of about 2 nm to about 5 nm. In another embodiment, the conductive material that forms the gate electrode layers 120 can serve as a WFM layer.

Following the formation of the metal gate structures, the gate capping layers 122 can be fabricated by a process which generally comprises recessing the metal gate material to a target level below the planarized surface of the substrate, depositing a layer of dielectric material (e.g., SiN) to fill the recessed region above the gate electrode layers 120, and then planarizing the surface of the semiconductor structure down to an upper surface of the first insulator layer 116 to remove the overburden dielectric material and form the gate capping layers 122.

Figure 8A:
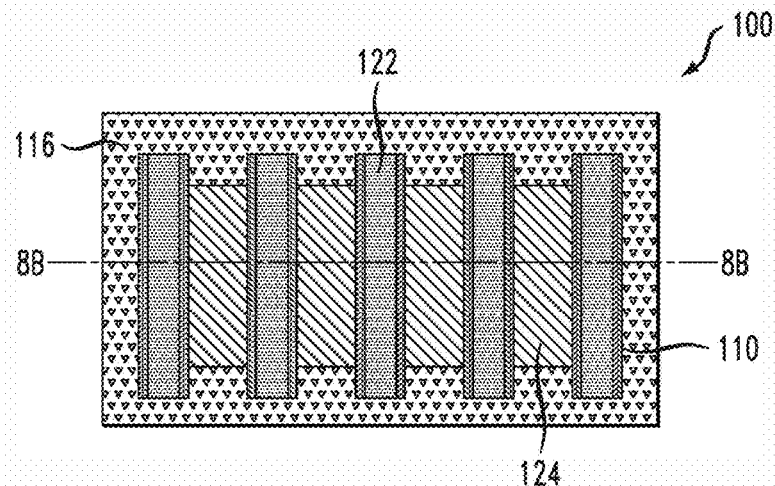
FIGS. 8A and 8B depict a plan view and cross-sectional view of the semiconductor device after selective etching of insulator material on the source-drain regions and deposition of a metallic material and planarization of the top surface, in accordance with an embodiment of the invention.
Figure 8B:
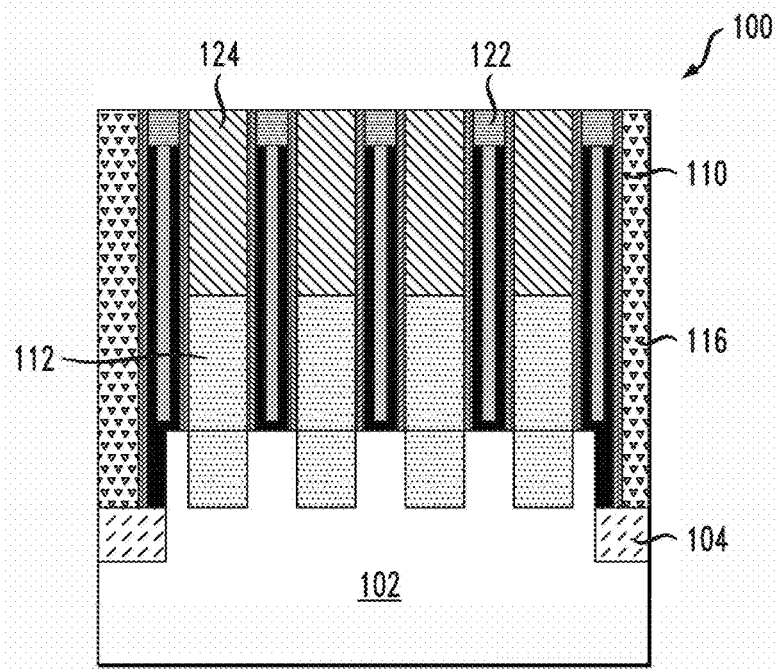

FIGS. 8A and 8B depict a plan view and cross-sectional view of the semiconductor device after selective etching of the first insulator layer 116 on the S/D regions 112, and then depositing and planarizing conductive metallic material 124. In this exemplary embodiment, the first insulator layer 116 is selectively removed to expose the S/D regions 112, using conventional etching processes. For example, an etch mask can be photolithographically formed on the planarized surface of the semiconductor structure 100. The first insulator layer 116 is then patterned using the etch mask to form openings through the first insulator layer 116 down to the S/D regions 112. The openings can be formed down to a level that exposes at least the upper surface of the S/D regions. A layer of conductive metallic material 124, such as tungsten, is then deposited to completely fill the openings, followed by a planarization process (e.g., CMP) to planarize the surface of the semiconductor structure down to the top surface of the gate structure, i.e., the gate capping layers 122, and remove the overburden metallic material. If desired, an optional liner, for example, a Ti liner, can be deposited (not shown) along with conductive metal material 124. The liner can be deposited to a depth of about 5 nm; although other dimensions are also contemplated by the present invention. The liner can be deposited by a metal sputter or CVD process, and the metallic material can be deposited by, for example, a CVD process.

Figure 9A:
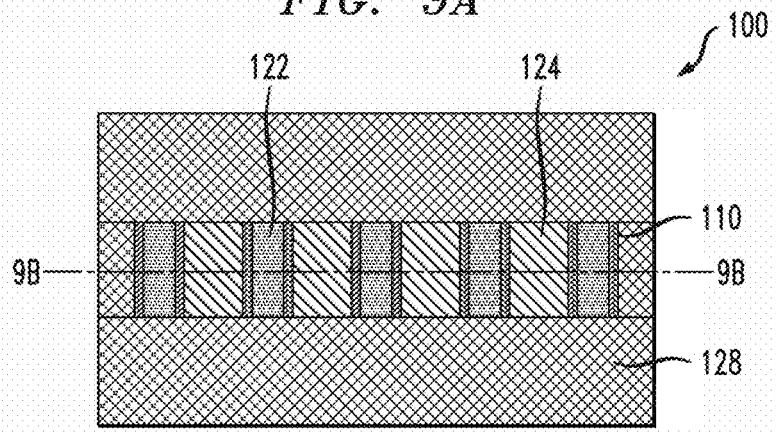
FIGS. 9A, 9B, 10A and 10B depict a plan view and cross-sectional view of the semiconductor device after recessing an upper portion of the metallic material using an etch mask, in accordance with an embodiment of the invention.
Figure 9B:
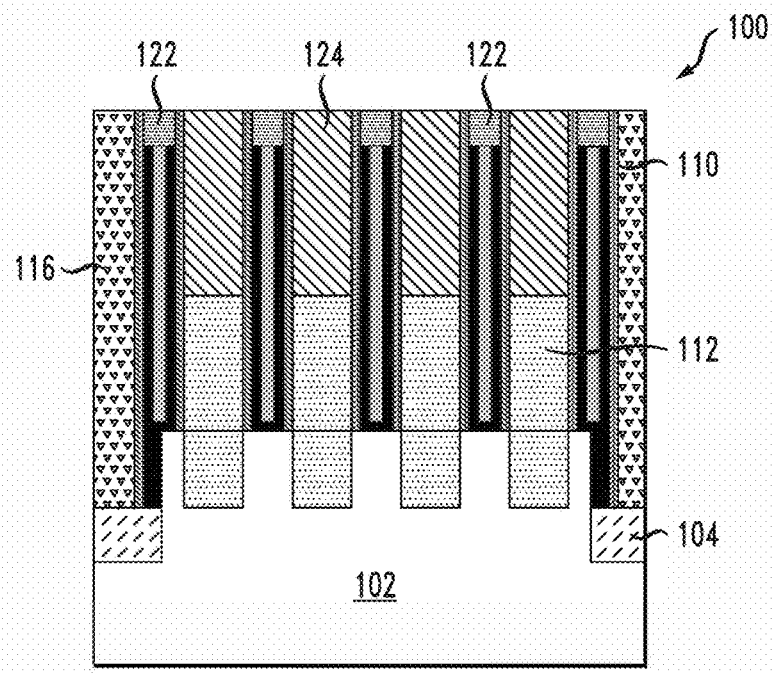
Figure 10A:
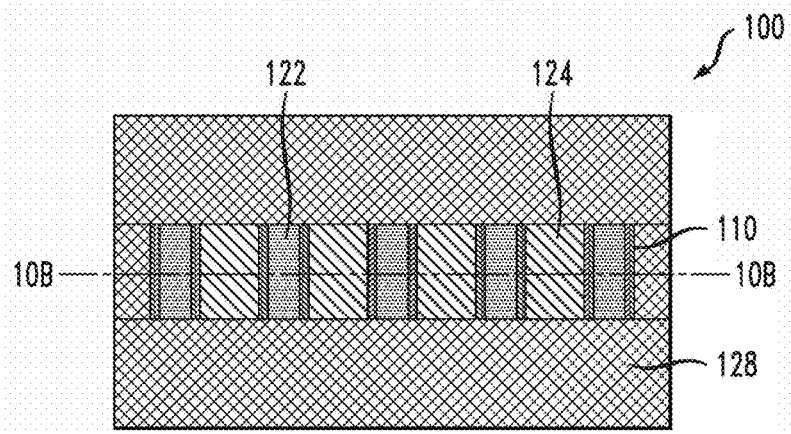
Figure 10B:
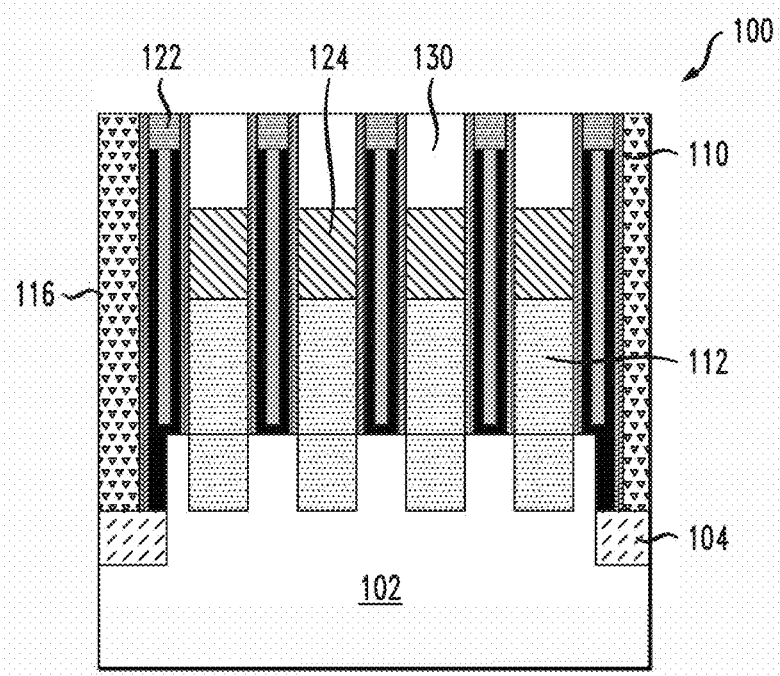

FIGS. 9A, 9B, 10A and 10B depict a plan view and cross-sectional view of the semiconductor device after recessing an upper surface of the conductive metallic material 124 using an etch mask 128. In this exemplary embodiment, etch mask 128 is applied over the top surface of the semiconductor device 100. The etch mask 128 can be a photoresist mask that is patterned using standard photolithography techniques to provide a desired width for forming openings 130 (see FIGS. 11A-11C) of conductive metallic material 124 to be recessed, as shown in FIGS. 9A and 9B. In one embodiment, the desired width is between about 20 nm to about 40 nm. Next, conductive metallic material 124 is recessed down to a target level (desired height) below the planarized surface of the semiconductor structure to form recessed portions of openings 130 and exposing a top portion of metallic material 124, as shown in FIGS. 10A and 10B. In one embodiment, the target level is a height of between about 20 nm to about 50 nm. Conductive metallic material 124 can be recessed using an etch process and etch environment which is suitable to etch the conductive metallic material selective to the gate capping layer 122, dielectric layer 118 and gate electrode layer 120.

Figure 11A:
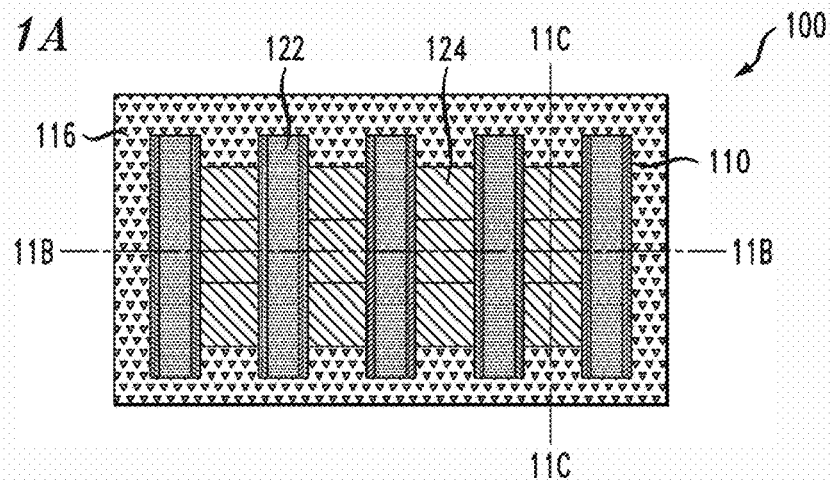
FIGS. 11A-11C depict a plan view and cross-sectional views of the semiconductor device after stripping the etch mask, in accordance with an embodiment of the invention.
Figure 11B:
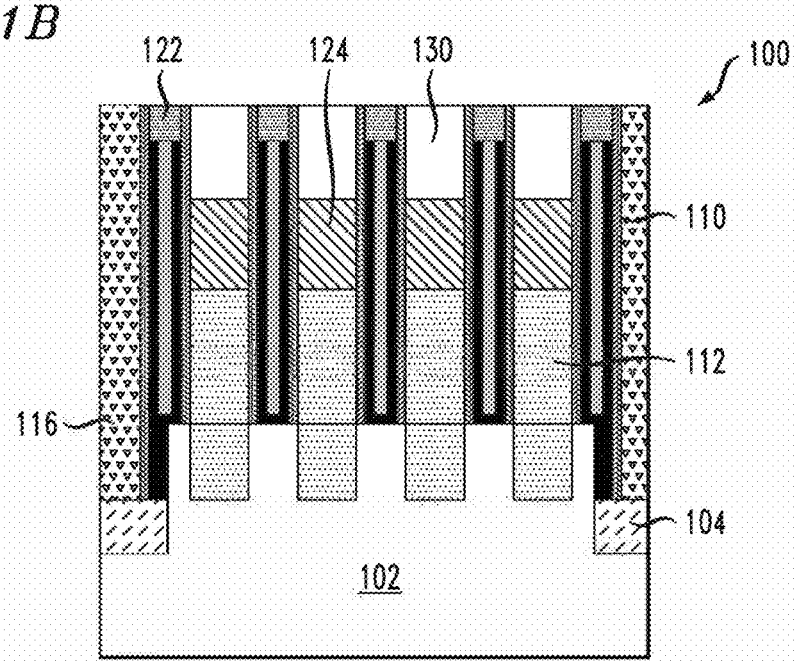
Figure 11C:
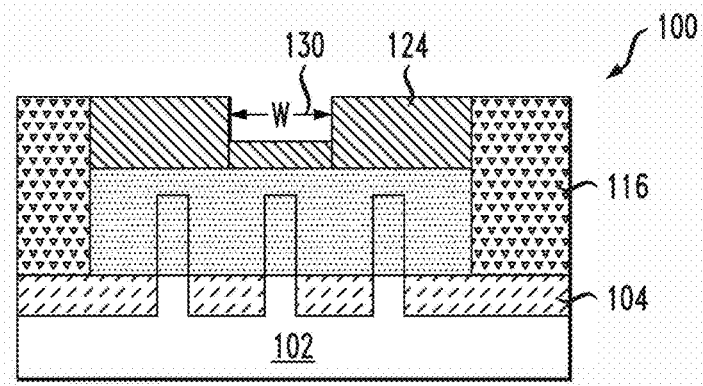

Following the recess process, the etch mask 128 is stripped, resulting in the semiconductor structure 100 having opening 130 of a desired width W in metallic material 124, as shown in FIGS. 11A-11C. A desired width W is formed that can provide large enough opening for subsequent gate contact.

Figure 12A:
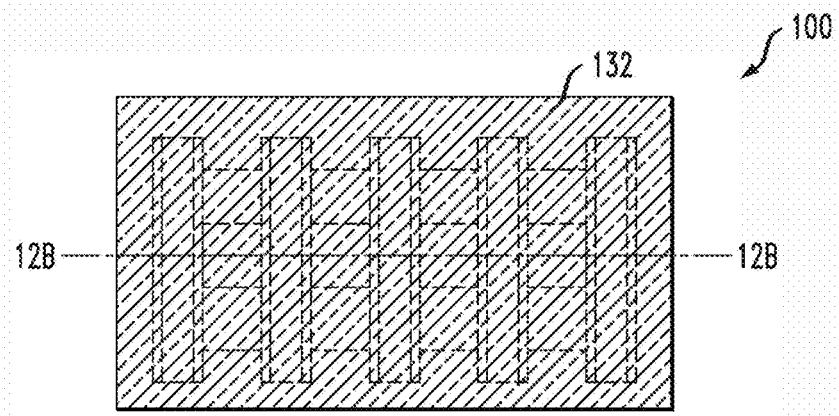
FIGS. 12A and 12B depict a plan view and cross-sectional view of the semiconductor device after deposition of a second insulator layer into the recessed portions and over the top surface of the gate capping layer and first insulator layer, in accordance with an embodiment of the invention.
Figure 12B:
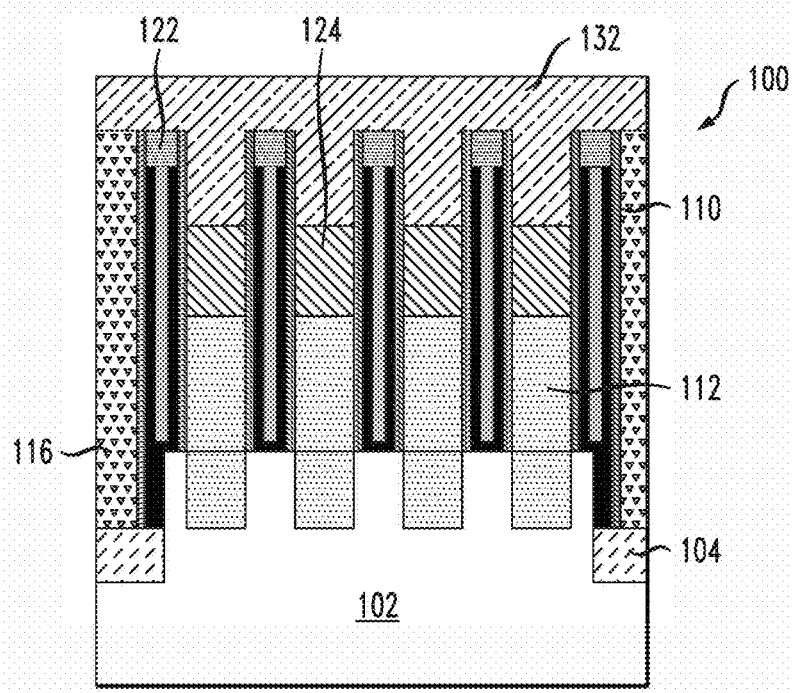

FIGS. 12A and 12B depict a plan view and cross-sectional view of the semiconductor device 100 after a second insulator layer 132 is deposited into the recessed portions of opening 130 and over the top surface of the gate capping layer 122 and first insulator layer 116. In this exemplary embodiment, the second insulator layer 132 can be formed of the same or similar materials as the first insulator layer 116. The top surface of second insulator layer 132 is then planarized.

Figure 13A:
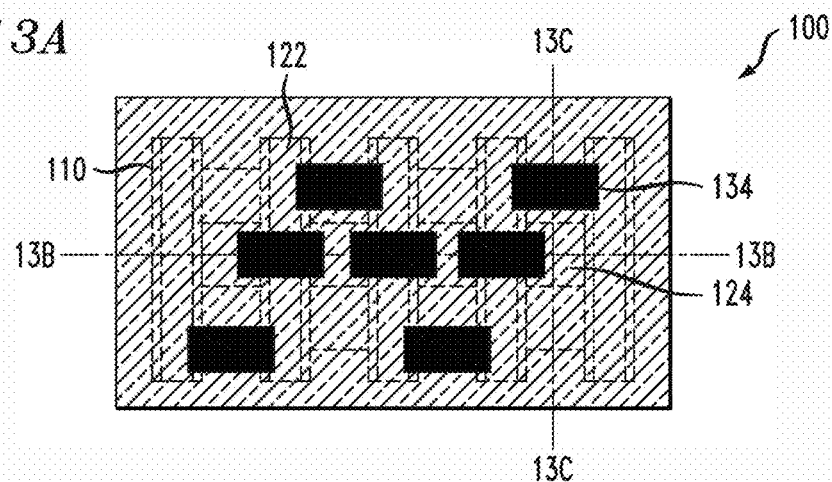
FIGS. 13A-13C depict a plan view and cross-sectional views of the semiconductor device after the formation of one or more metal via contacts, in accordance with an embodiment of the invention.
Figure 13B:
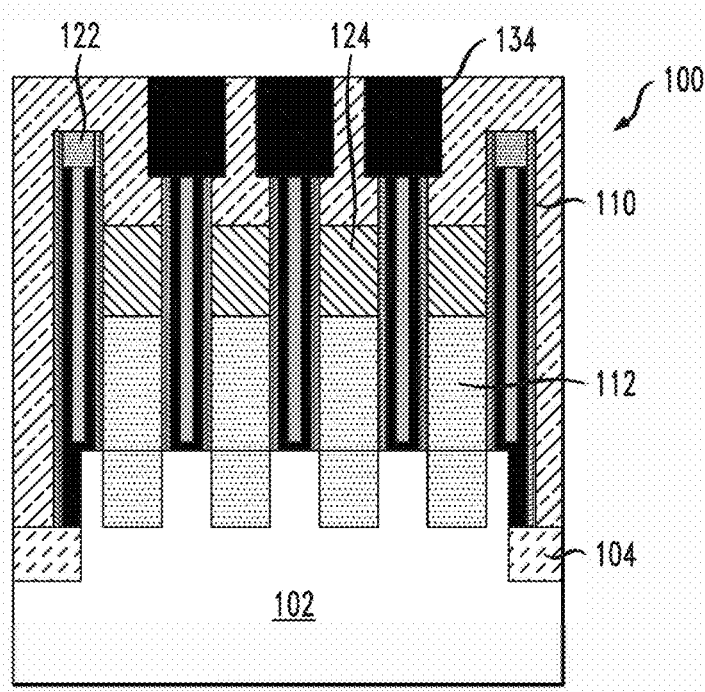
Figure 13C:
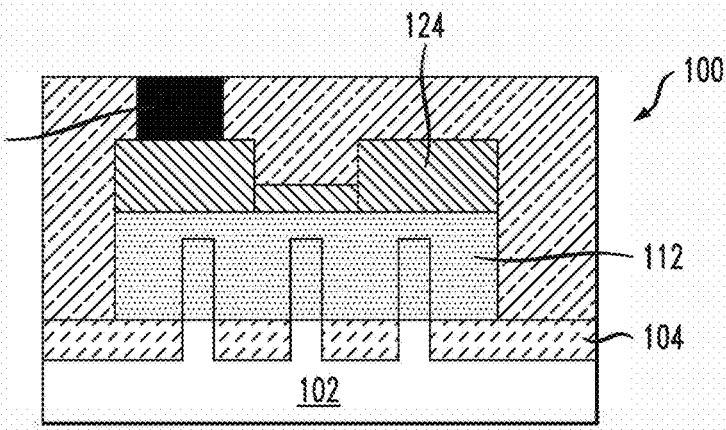

FIGS. 13A-13C depict a plan view and cross-sectional views of the semiconductor device 100 after forming one or more metal contacts 134 in the second insulator layer 132 wherein a bottom surface of the one or more metal contacts 134 is in contact with at least a portion of the upper surface of the gate structure (i.e., the gate spacer material 110, gate dielectric layer 118 and gate electrode layer 120) and is positioned in at least a portion of the second insulator layer 132 configured to be deposited over the upper surface of the conductive metallic material 124. For example, the process can include forming a metal contact etch mask on the second insulator layer 132 (not shown). The metal etch mask comprises an opening which defines an image of a metal via contact to be subsequently formed in the second insulator layer 132. The metal contact etch mask can be a photoresist mask that is formed using standard photolithography techniques.

Next, the second insulator layer 132, gate dielectric layer 118 and gate electrode layer 120 are patterned using the metal contact etch mask to expose at least a portion of an upper surface of the gate dielectric layer 118 and gate electrode layer 120 and at least a portion of the second insulator layer 132 configured to be deposited over the upper surface of the conductive metallic material 124. The patterning process can be performed using one or more sequential etch processes to etch the materials of the second insulator layer 132, gate capping layer 122 and the gate spacer 110 and exposing a surface of the gate spacer 110, gate dielectric layer 118 and gate electrode layer 120. The process flow continues with removing the metal contact etch mask, and filling the metal via contact openings with an interconnect conductor to form metal via contacts 134. For example, FIGS. 13B and 13C are schematic views of the semiconductor device of FIG. 13A after forming an interconnect conductor 134 in contact with the second insulator layer 132 and gate spacer 110, gate dielectric layer 118 and gate electrode layer 120. Conductor 134 also will contact source drain contact 124 outside the trench formed on conductive metallic material 124.

The interconnect conductor 134 can be formed by depositing a layer of interconnect conductor to fill the metal via contact openings with an interconnect conductor such as Cu, W, Al, Ag, Au, a multilayered stack thereof, or an alloy thereof. After depositing the layer of interconnect conductor, a planarizing process (e.g., CMP) is performed to remove the overburden interconnect conductor down to an upper surface of the second insulator layer 132, resulting in the semiconductor structure shown in FIGS. 13A-13C.

It is to be understood that the methods discussed herein for fabricating semiconductor structures can be incorporated within semiconductor processing flows for fabricating other types of semiconductor devices and integrated circuits with various analog and digital circuitry or mixed-signal circuitry. In particular, integrated circuit dies can be fabricated with various devices such as transistors, diodes, capacitors, inductors, etc. An integrated circuit in accordance with embodiments can be employed in applications, hardware, and/or electronic systems. Suitable hardware and systems for implementing embodiments of the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein.

Furthermore, various layers, regions, and/or structures described above may be implemented in integrated circuits (chips). The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Although illustrative embodiments have been described herein with reference to the accompanying drawings, it is to be understood that the invention is not limited to those precise embodiments, and that various other changes and modifications may be made by one skilled in art without departing from the scope or spirit of the invention.

What is claimed is:

1. A semiconductor device comprising:
    a plurality of semiconductor fins patterned in a starting semiconductor substrate;
    a set of gate structures disposed on the starting semiconductor substrate;
    a set of spacers disposed around each of the gate structures;
    a source and drain region disposed around the plurality of semiconductor fins and between the set of gate structures;
    a conductive metal material disposed on the source and drain region, wherein a top surface of the conductive metal material is below a top surface of the gate structures;
    an insulating layer disposed on the top surface of the conductive metal material and over the top surface of the set of gate structures, wherein the insulating layer defines an opening therein over given ones of adjacent gate structures, the opening having a width configured to expose the top surface of the gate structure and a portion of the insulating layer adjacent the top surface of the gate structure; and
    a plurality of metal contacts disposed in the opening of the insulator layer and over the given ones of adjacent gate structures, wherein a bottom surface of each of the plurality of metal contacts is in contact with the top surface of the respective gate structure.

2. The semiconductor device of claim 1, wherein the starting semiconductor substrate comprises one or more of Si, group III-V semiconductor materials, group II-VI semiconductor materials, Ge, and SiGe.

3. The semiconductor device of claim 1, wherein the source and drain region is an epitaxial grown source and drain region.

4. The semiconductor device of claim 1, wherein the set of gate structures comprises a gate electrode layer, a gate dielectric layer, and a gate sidewall spacer.

5. The semiconductor device of claim 1, wherein the insulating layer comprises an oxide material.

6. The semiconductor device of claim 1, wherein the plurality of metal contacts comprise copper.

7. The semiconductor device of claim 1, which comprises a field effect transistor device.

8. The semiconductor device of claim 1, wherein the conductive metal material is tungsten.

9. The semiconductor device of claim 4, wherein the gate dielectric layer comprises a high-k dielectric material.

10. A semiconductor device comprising:
a field effect transistor device on a semiconductor substrate;
the field effect transistor device comprising:
a source and drain region;
a conductive metal material disposed on the source and drain region;
a set of gate structures comprising a gate electrode layer and a gate sidewall spacer, wherein a top surface of the conductive metal material is below a top surface of the set of gate structures;
an insulating layer disposed on the top surface of the conductive metal material and over the top surface of the set of the gate structures, wherein the insulating layer defines an opening therein over given ones of adjacent gate structures, the opening having a width configured to expose the top surface of the gate structure and a portion of the insulating layer adjacent the top surface of the gate structure; and
a plurality of metal contacts disposed in the opening of the insulator layer and over the given ones of adjacent gate structures, wherein a bottom surface of each of the plurality of metal contacts is in contact with the top surface of the respective gate structure.

11. The semiconductor device of claim 10, wherein the source and drain region is an epitaxial grown source and drain region.

12. The semiconductor device of claim 10, wherein the gate structure comprises a gate electrode layer, a gate dielectric layer, and a gate sidewall spacer.

13. The semiconductor device of claim 10, wherein the insulating layer comprises an oxide material.

14. The semiconductor device of claim 10, wherein the plurality of metal contacts comprise copper.

15. The semiconductor device of claim 10, wherein the conductive metal material is tungsten.

16. An integrated circuit comprising:
one or more semiconductor structures, wherein at least one of the semiconductor structures comprises:
a plurality of semiconductor fins patterned in a starting semiconductor substrate;
a set of gate structures disposed on the starting semiconductor substrate;
a set of spacers disposed around each of the gate structures;
a source and drain region disposed around the plurality of semiconductor fins and between the set of gate structures;
a conductive metal material disposed on the source and drain region, wherein a top surface of the conductive metal material is below a top surface of the gate structures;
an insulating layer disposed on the top surface of the conductive metal material and over the top surface of the set of gate structures, wherein the insulating layer defines an opening therein over given ones of adjacent gate structures, the opening having a width configured to expose the top surface of the gate structure and a portion of the insulating layer adjacent the top surface of the gate structure; and
a plurality of metal contacts disposed in the opening of the insulator layer and over the given ones of adjacent gate structures, wherein a bottom surface of each of the plurality of metal contacts is in contact with the top surface of the respective gate structure.

17. The integrated circuit of claim 16, wherein the source and drain region is an epitaxial grown source and drain region.

18. The integrated circuit of claim 16, wherein the set of gate structures comprises a gate electrode layer, a gate dielectric layer, and a gate sidewall spacer.

19. The integrated circuit of claim 16, wherein the plurality of metal contacts comprise copper.

20. The integrated circuit of claim 16, which comprises a field effect transistor device.

\* \* \* \* \*